(12) United States Patent
Wojnarowski et al.

(10) Patent No.: US 6,483,196 B1
(45) Date of Patent: Nov. 19, 2002

(54) FLIP CHIP LED APPARATUS

(75) Inventors: Robert J. Wojnarowski, Ballston Lake, NY (US); William P. Minnear, Clifton Park, NY (US); Pamela K. Benicewicz, Loudonville, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/542,037

(22) Filed: Apr. 3, 2000

(51) Int. Cl.[7] .............................................. H01L 29/40
(52) U.S. Cl. ...................................... 257/778; 257/432
(58) Field of Search ................................ 257/778, 737, 257/642, 432, 435

(56) References Cited

U.S. PATENT DOCUMENTS 5,475,417 A * 12/1995 Ogata et al. ................. 347/224
5,479,049 A * 12/1995 Aoki et al. .................. 257/642

* cited by examiner

Primary Examiner—Roy Potter
(74) Attorney, Agent, or Firm—Fay, Sharpe, Fagan, Minnich & McKee, LLP (57) ABSTRACT

A flip chip structure of a light-emitting device comprising a UV/blue light emitting diode (LED) is disclosed. The flip chip structure is optimized to produce unique light focusing and phosphor illumination out the bottom of the structure. The flip chip structure includes a substrate, a gallium nitride layer epitaxially grown on a top surface of the substrate, and one or more layers of lensing material deposited on a bottom surface of the substrate. The lensing material is preferably a polymer lensing material, an index matching material, or a mixture thereof. The gallium nitride layer is deposited in the form of one or more odd-sided polygons, for enhanced light extraction.

36 Claims, 11 Drawing Sheets

FLIP CHIP LED APPARATUS

BACKGROUND OF THE INVENTION

1. Field of the Invention

This invention pertains to a flip chip LED apparatus. More particularly, the invention relates to a flip chip structure of a light-emitting device comprising a UV/blue light emitting diode (LED) that is optimized to produce unique light output out of the bottom and focusing of that light to provide phosphor illumination, with high light extraction.

2. Discussion of the Art

Due to the discovery of UV and blue light emitting diodes (LEDs) of GaN-based epitaxial structures, it has become possible to generate white light from an LED by applying luminescent phosphor materials on top of the LED light output areas. These phosphor materials partially transform the UV or blue light of the GaN (gallium nitride), into longer wavelength light.

As used herein, the term "UV/blue LED" means an LED emitting in the UV range, or in the blue range, or in both the UV and blue ranges of the electromagnetic spectrum.

The successful implementation of the device is dependent upon the efficient conversion of UV/blue light into visible light and the subsequent efficient extraction of the generated visible light from the device. Many techniques have been previously used to collect this light efficiently in the wire bonded non-flip chip format, but the wires and die metals and diffusions cause irregularities which cannot be effectively overcome in the non-flip chip embodiment. In this mode, a UV/blue LED emits light all over the LED structure, including the top, bottom, and sides, but not at the same intensities.

Thus, there is a particular need for an improved UV/blue LED structure having an efficient conversion and extraction of light out of the device producing white light.

BRIEF SUMMARY OF THE INVENTION

There is a particular need for an improved GaN LED structure having an efficient conversion and extraction of light out of the device. The present invention optimizes light out the bottom of the LED structure in contrast to the traditional topside output from a prior art wire bonded LED structure. Motivation for the flip chip orientation is two-fold: First, in the flip chip orientation no bonding wires are present to obstruct the emission of light. Second, an optical model of the LED indicates that more light is emitted from the bottomside of the LED than from the topside.

Briefly, in accordance with one embodiment of the present invention, a semiconductor device formed in a flip chip structure is provided. The device comprises a substrate formed of a substantially transparent material. A semiconductor layer formed of gallium nitride is deposited on a top surface of the substrate. One or more layers of lensing material is deposited on a bottom surface of the device substrate. The lensing material is comprised of a polymer, an index matching material, or a mixture thereof.

A principal advantage of the present invention is that a UV/blue LED structure is disclosed that primarily enhances light output from the bottom and sides of the structure.

Still another advantage of the present invention is that lens materials and phosphor material can be applied to the bottom (sapphire/substrate side) surface of a flip chip die to direct the light from a flip chip UV/blue LED thus directing and gathering it.

Still a further advantage of the present invention is that an inexpensive structure is disclosed that is capable of obtaining uniform light from a UV/blue flip chip LED structure.

Still a further advantage of the present invention is that the performance of the semiconductor layer is optimized by depositing it on the top surface of the substrate in the form of one or more odd-sided polygons.

Still another advantage of the present invention is that an un-packaged UV/blue LED structure, to be used in a flip chip format, is disclosed that includes polymers applied to the bottom surface of the die that do not block the light in the blue or UV region of the spectra, but function as lenses and aid in light extraction by optimizing the optical indexes of the materials.

Still another advantage of the present invention is that an un-packaged UV/blue LED structure to be used in a flip chip format is disclosed that includes a polymer and monomer used as a solvent that is applied and cross-linked to the back of the LED die. The cross-linked material does not block the light in the blue or UV region of the spectra and may, additionally, be phosphor-filled to yield white light.

Still another advantage of the present invention is that phosphor and/or index matching materials are applied to the bottom and sides of a UV/blue flip chip LED structure to optimize light extraction and output.

Still a further advantage of the present invention is that an inexpensive assembly structure for LED technology is disclosed that uses flip chip technology and an optimized UV/blue LED device structure to emit light primarily from the bottom and sides of the die.

Still another advantage of the present invention is that a method of assembly for a UV/blue LED is disclosed which does not entail the use of a conventional lead cup frame assembly process.

Still another advantage of the present invention is that a UV/blue LED structure having enhanced optical characteristics is disclosed.

Still another advantage of the present invention is that novel frame assemblies incorporating the UV/blue LED of the present invention are provided.

DETAILED DESCRIPTION OF THE INVENTION

Figure 1:
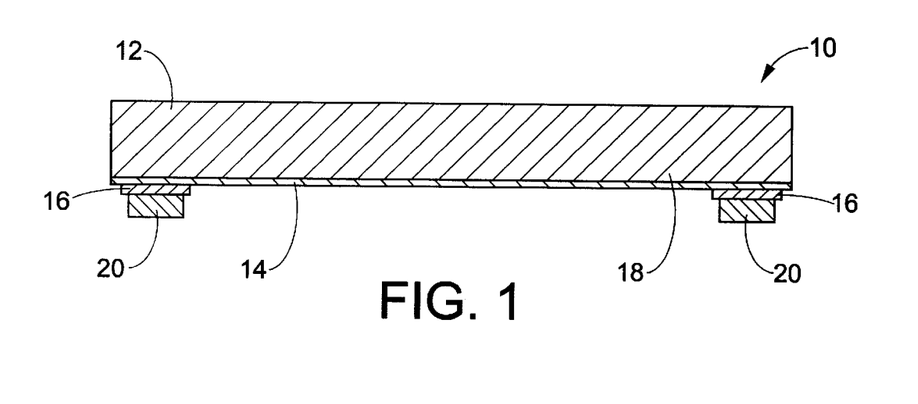
FIG. 1 is a cross-sectional view diagram of a flip chip micro (hereinafter micro or μ) ball grid array (micro BGA) structure.

Referring particularly to FIG. 1, a cross-sectional view schematic diagram of a flip chip micro ball grid array (micro BGA) structure is illustrated. The semiconductor layer 14 is grown on the top surface (wafer deposition side) of a transparent substrate 12. The semiconductor layer 14 preferably comprises gallium nitride (GaN) of a thickness well-known to those skilled in the art, typically 0.10 micrometers to about 10 micrometers. For purposes of example, the semiconductor layer 14 typically includes an n-type semiconductor layer underlying a p-type semiconductor layer.

Micro ball grid array (micro BGA) bonding pads 16 are attached to semiconductor layer 14 on a contact surface 18 of the LED structure. The micro BGA bonding pad 16 typically comprises one or more layers of metals such as gold, nickel, aluminum, platinum, chromium, indium, and/or tin, for example. In the preferred embodiment, the bonding pad 16 comprises titanium/tungsten/nickel/gold (Ti/W/Ni/Au) with the Ti/W ranging from 500 to 5000 angstroms, the Ni ranging from 5000 to 20000 angstroms, and the gold ranging from 300 to 1500 angstroms.

Substrate 12 may comprise a substantially transparent material such as sapphire (aluminum oxide), for example. "Substantially transparent" is intended to mean sufficiently transparent to transmit a useful amount of light therethrough. Exemplary materials which are useful for this purpose include sapphire or spinel. "Spinel" refers to a group of minerals having the general formula $AB_2O_4$ wherein A is magnesium, ferrous ion, zinc, manganese or a combination thereof, and B is aluminum, ferric ion, chromium, or a combination thereof. In the preferred embodiment, the substrate 12 is comprised of sapphire, a single crystal aluminum oxide ($Al_2O_3$) generally used for semiconductor processing.

The thickness of the substrate 12 is not a critical factor and will depend upon the particular application. The thickness typically ranges from about 80 to about 500 microns but may be ground thinner depending upon the application.

The flip chip solder bump 20 is of the kind well-known to those skilled in the art.

Figure 2:
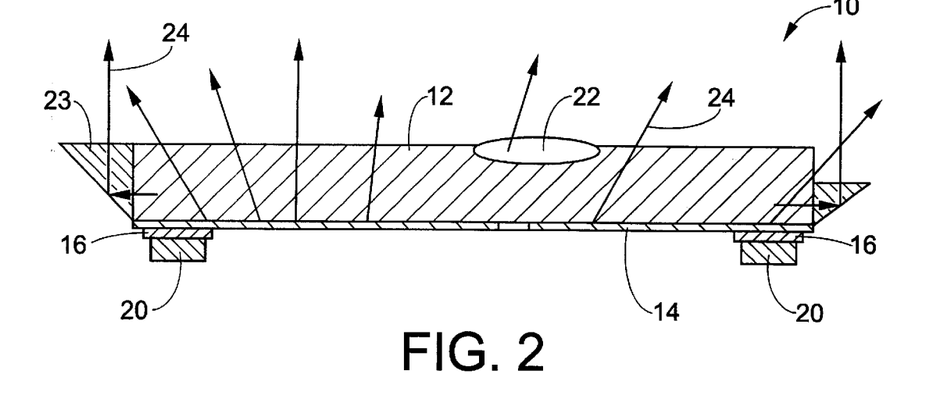
FIG. 2 is a flip chip micro BGA structure illustrating a 90 degree reflector.

FIG. 2 shows the flip chip micro ball grid array of FIG. 1, including laser machining/ablation areas 22. In this regard, the substrate 12 is machined by direct laser patterning to form a patterned or lens structure, a process well-known to those skilled in the art. An excimer laser, a Nd:YAG laser, and many others are suitable for this purpose. In this regard, the light is turned 90 degrees upward at the sides of the trapezoidal structure, thus negating the need for the cup-like structure illustrated in FIGS. 7 and 8. The laser ablation areas 22 aid in the extraction of the light from a polished box structure.

In addition, the light emitting from the top (wafer deposition side) of the LED structure 10 can also be redirected out the bottom to further increase light output. The reflector 23 (shown as 90 degrees in FIG. 2) turns the light upward. As appreciated by those skilled in the art, the reflector 23 could be formed at angles other than 90 degrees depending upon the desired application. The triangular reflector 23 is formed by sawing, laser machining, or application of a polymer material such as PMMA (polymethyl methacrylate) or any polymer that has a lower optical index than $Al_2O_3$. Optionally, a mirrored surface can be formed on the reflector 23 in place of the polymer to achieve the desired effect by, e.g., sputtering or vapor deposition.

The polymer material used to form the angled turn or reflector 23 can be applied using a pipette or any other auto dispensing equipment known in the art. The top of the substrate 12 is placed on a non-stick surface, e.g., teflon, polyethylene, wax or any other non-stick material known by those skilled in the art, while the reflector 23 is formed.

Figure 3:
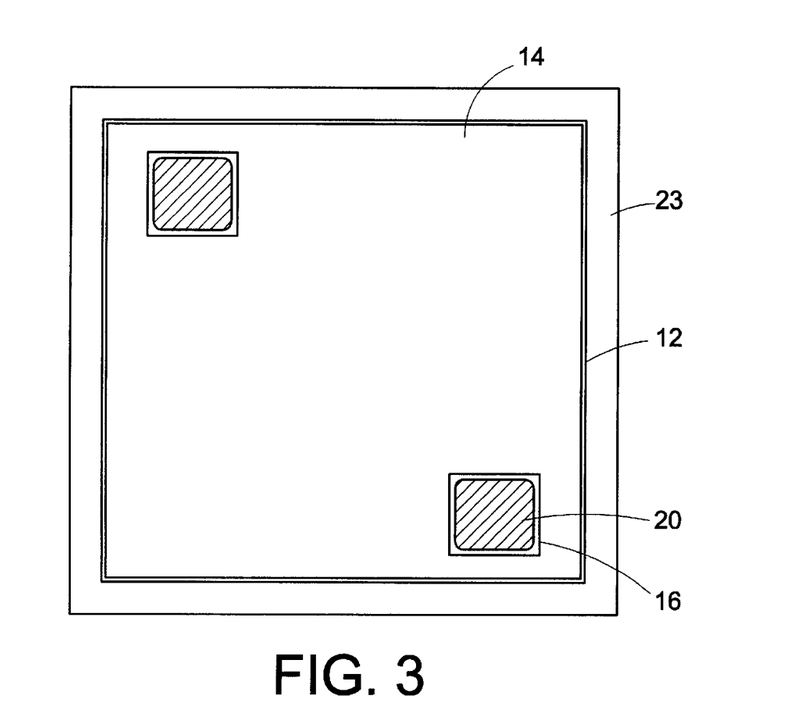
FIG. 3 is a top view schematic diagram of the wafer deposition side of the die of FIG. 2 illustrating a patterned GaN area.
Figure 4:
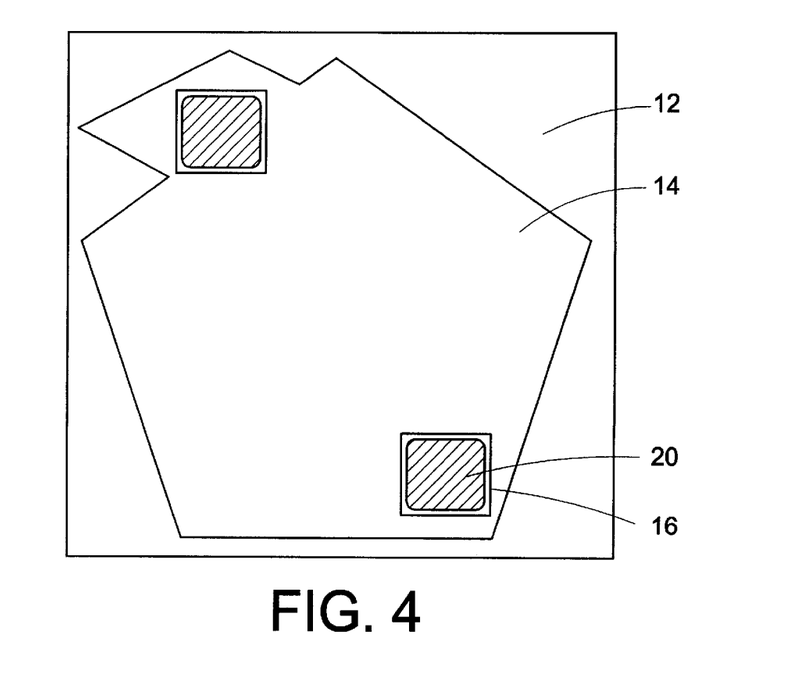
FIG. 4 is a top view schematic diagram of the wafer deposition side of the die of FIG. 2 illustrating a patterned GaN area.

FIG. 3 illustrates a top view (wafer deposition side) of the LED die structure 10 of FIG. 2 having the 90 degree light reflector 23 applied thereon. Total internal reflection traps light in the GaN layer 14 for a square box-like configuration. The LED die structure 10 illustrated in FIG. 4 includes a GaN deposition layer 14 deposited in the form of a polygonal shape having more than four sides. An odd number of sides for the deposited gallium nitride layer results in the optimal liberation of light. This has been confirmed by an optical model of the LED.

Figure 5:
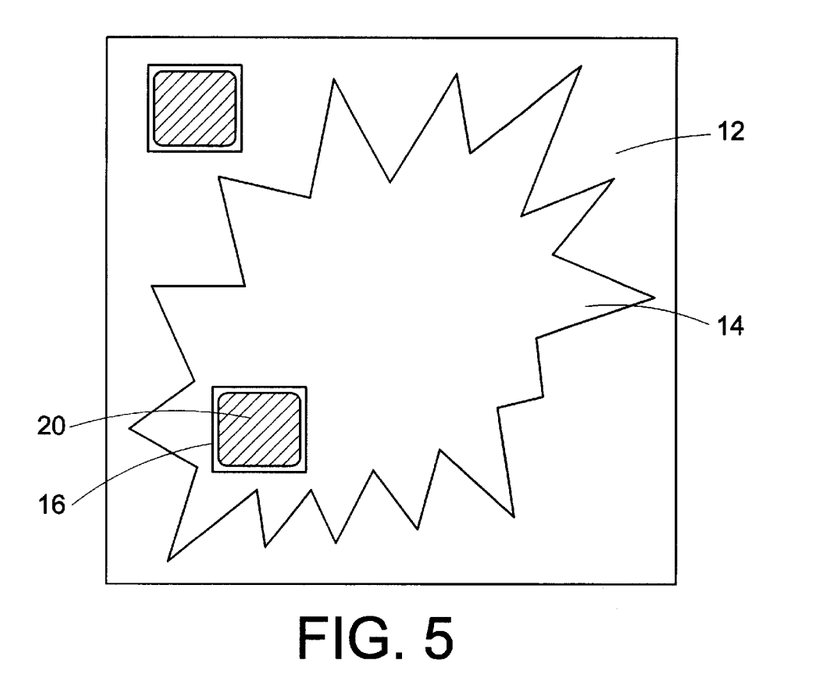
FIG. 5 is a top view schematic diagram of the wafer deposition side of the die of FIG. 2 illustrating a patterned GaN area.
Figure 6:
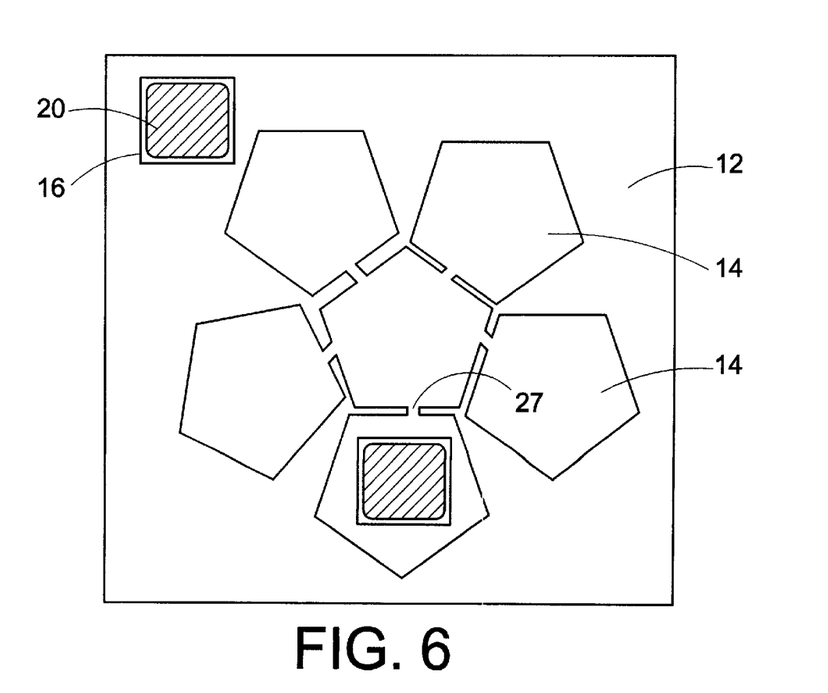
FIG. 6 is a top view schematic diagram of the wafer deposition-side of the die of FIG. 2 illustrating a patterned GaN area.

In the embodiment of FIG. 5, an odd-sided polygonal diffusion area is deposited for optimum liberation of light. Further, in the embodiment of FIG. 6, multi-site polygonal diffusion areas of GaN are deposited and electrically connected by tabs 27.

Figure 7:
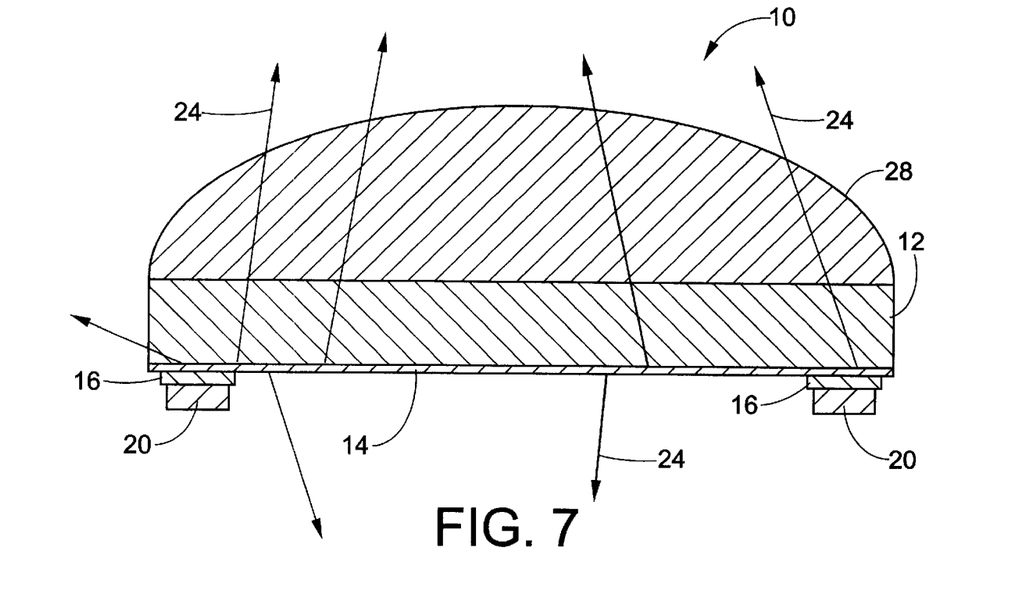
FIG. 7 is a cross-sectional view diagram of a flip chip micro BGA structure having the polymer lensing material and index matching material of the present invention.

FIGS. 7–22 illustrate other various embodiments of the present invention. For example, FIG. 7 illustrates a LED structure 10 including a lensing material layer 28 deposited on the back surface of the substrate 12 and comprising a mixture of polymer lensing material 30 and index matching material 32.

The lensing material 30 and index matching material 32 may be selected from a great number of polymers having a lower index of refraction than substrate 12 and the semiconductor layer 14. Suitable polymer lensing materials 30 or index matching material 32 are set out below in TABLE I.

TABLE I

| Polymer | Index of Refraction |
| --- | --- |
| TEFLON ® AF-1600 (DuPont) | 1.29–1.31 |
| TEFLON PFA (Dupont) | 1.34 |
| PMMA | 1.49–1.56 |
| Epoxies | 1.5–1.6 |
| Polycarbonate (GE) | 1.573 |
| Parylene C (Novatran Corp.) | 1.639 |
| Parylene N | 1.661 |
| Parylene D | 1.669 |
| Polyetherimide (GE) | 1.641 |
| Polyimides: | |
| KAPTON (Du Pont) | 1.66 |
| SPI-129 (MicroSi) | 1.732 |
| PI-2555 (DuPont) | 1.702 |
| SIXEF-44 (Hoescht) | 1.627 |
| XU-218 (Ciba-Geigy) | 1.614 |
| PI (Honeywell) | 1.62–1.65 |
| PROBIMIDE ® 400 (Ciba-Geigy) | 1.64 |
| Silicone: | |
| Silicone (RTV) | 1.4–1.5 |

The material 30, 32 can be applied by any automated or manual methods well-known to those skilled in the art. A cycloalaphatic epoxy such as CY179, made by Ciba Geigy Chemicals, is one choice of a suitable material. The CY179 material is catalyzed by a GE material from GE Silicones of Waterford N.Y. sold under the trademark Octacat®, which enables UV and heat curing of the epoxy. Generally 1–3% of Octacat® is used for proper curing conditions. A co-catalyst of copper napthanate, at 3–10 ppm, is used in connection with epoxy solids. The epoxy has a natural surface tension wall at the sharp edges of the die, and naturally forms dome-like structures. The viscosity of the epoxy may be lowered by incorporation of solvents such as anisole, monomers such as BGE (butyl glycidal ether), and plasticizers such as styrene.

As shown in FIG. 7, the sharp edges of the LED die structure 10 and surface tension of the lensing material layer 28 comprising polymer lensing material 30 and index matching material 32 inherently form a dome-like structure on the bottom of the die surface 12. The layer 28 may be applied by metered pipettes, for example, and subsequently dried or cured in place by air or vacuum drying, ultra violet light cross-linking or by heat curing. In the preferred embodiment, the lensing material layer 28 is applied to substrate 12 and UV light in the 360 nano-meter range is used to cure. Drying of the layer 28 may be aided by a warm air cross flow oven, or vacuum oven. The light in the embodiment of FIG. 7 is emitted in all directions from the LED die structure 10 and is redirected by the layer 28 to form a directed and convergent light focus.

Figure 8:
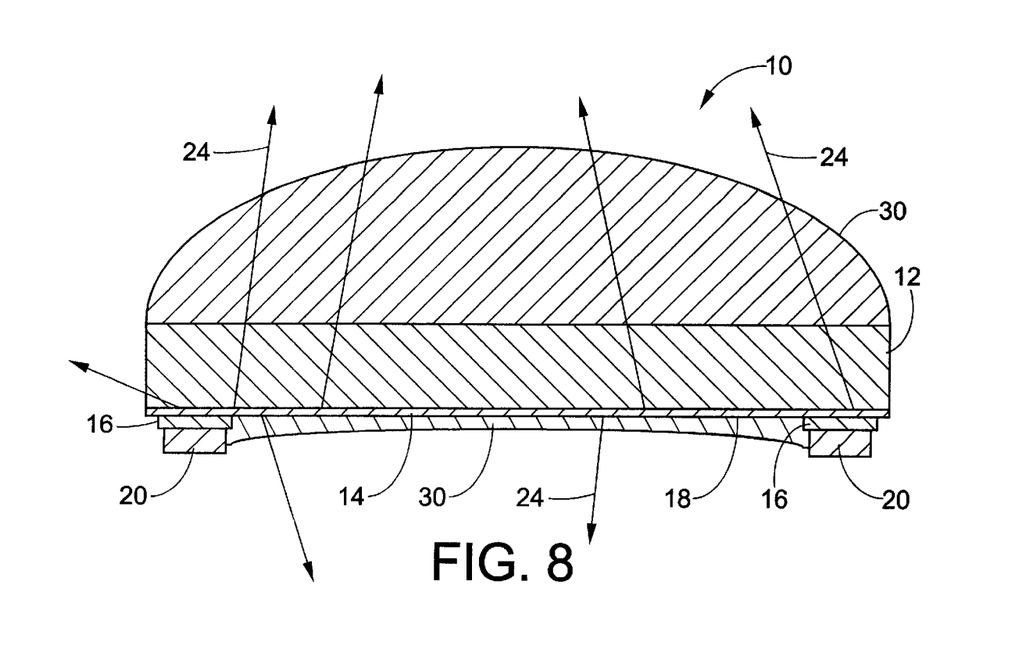
FIG. 8 is a cross-sectional view diagram of a flip chip micro BGA structure having the polymer lensing material and index matching material of the present invention.

FIG. 8 demonstrates another embodiment of the present invention wherein polymer lensing material 30 is also disposed on the contact surface 18 of the semiconductor layer 14. This allows the light to be focused and optimized for uniformity out the bottom and the sides of the LED structure 10. This embodiment is of special significance in the unique application of phosphors for white light LED structures. In accordance with the structure of FIG. 8, the light emits in all directions (i.e., directed-convergent) and is redirected at the top and bottom of the LED die 10. The die 10 is made with light reflecting electrodes 34 to re-direct the light out the bottom to enhance light extraction. Additionally, the polymer lensing material 30 aids in this effort.

Figure 9:
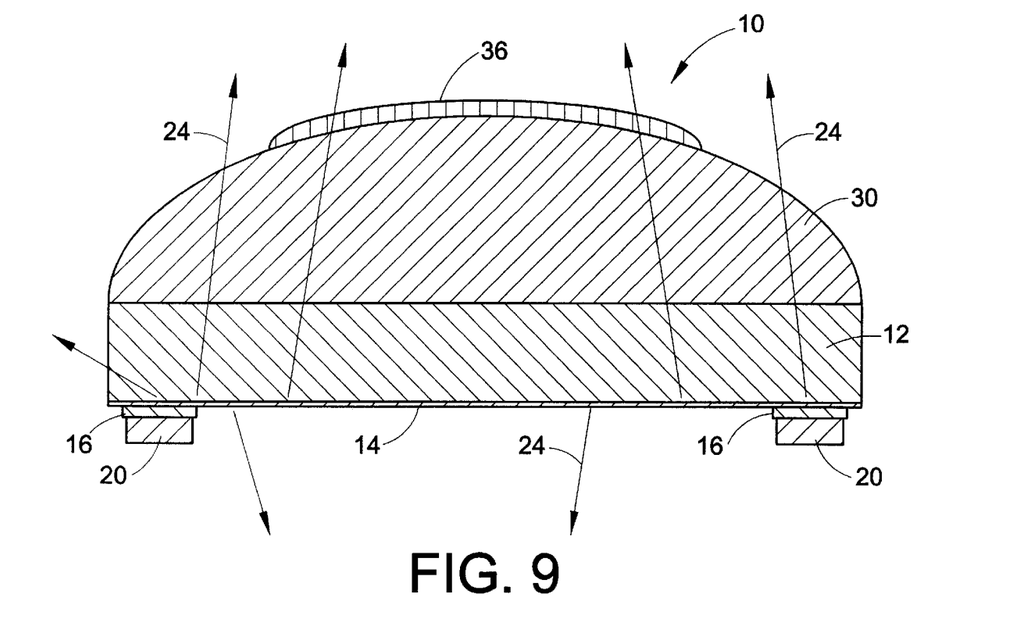
FIG. 9 is a cross-sectional view diagram of a flip chip micro BGA structure of the present invention, including a patterned fresnel lens structure on the surface of the polymer lensing material.

FIG. 9 illustrates another embodiment of LED structure 10, including a patterned fresnel lens 36 on the topmost surface of the polymer lensing material 30. The fresnel lens 36 is well-known by those skilled in the art and is typically formed by laser ablation, mask plasma pattering, e.g. The light in FIG. 9 emits in all directions (i.e., directed-convergent). Laser patterning or ablation aids this process by forming a lens 36 that aids in light gathering from otherwise scattered lost light areas.

Figure 10:
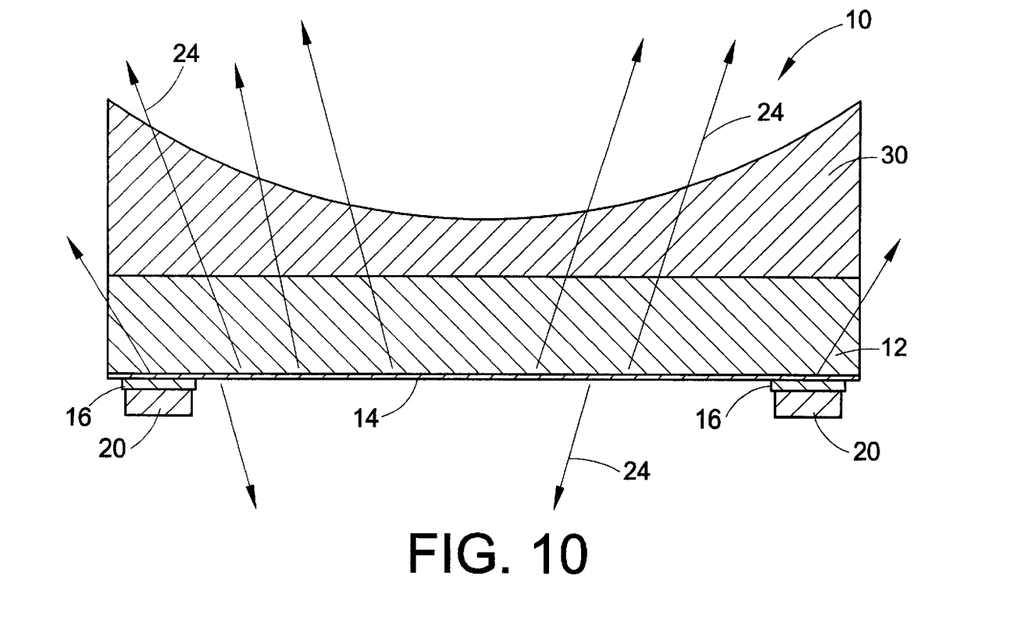
FIG. 10 is a cross-sectional view diagram of a flip chip micro BGA structure illustrating a configuration of the polymer lensing structure of the present invention.

FIG. 10 shows another structure wherein the polymer lensing material 30 is formed on the bottom surface of the substrate 12 to diverge the light 24. The polymer lensing material 30 is formed in such a manner using laser patterning and laser ablation. The laser ablation process forms the optical curvature needed by design to obtain proper or desired focus parameters.

Figure 11:
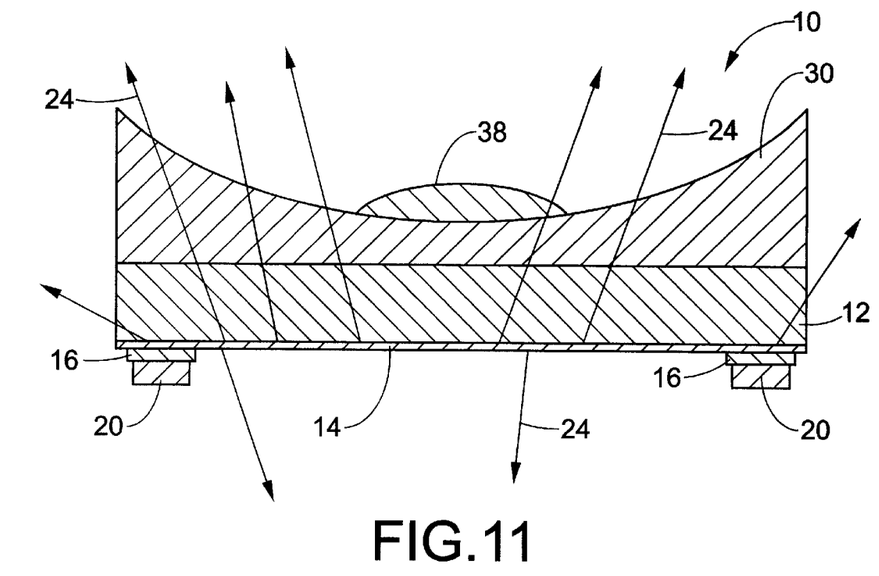
FIG. 11 is a cross-sectional view diagram of a flip chip micro BGA structure illustrating a configuration of the polymer lensing structure of the present invention.

FIG. 11 is the LED structure of FIG. 10, including an optimization lens 38 formed by a laser patterning process in the polymer lensing material 30 to optimize the light pattern or light density on the surface of the polymer lensing material 30.

Figure 12:
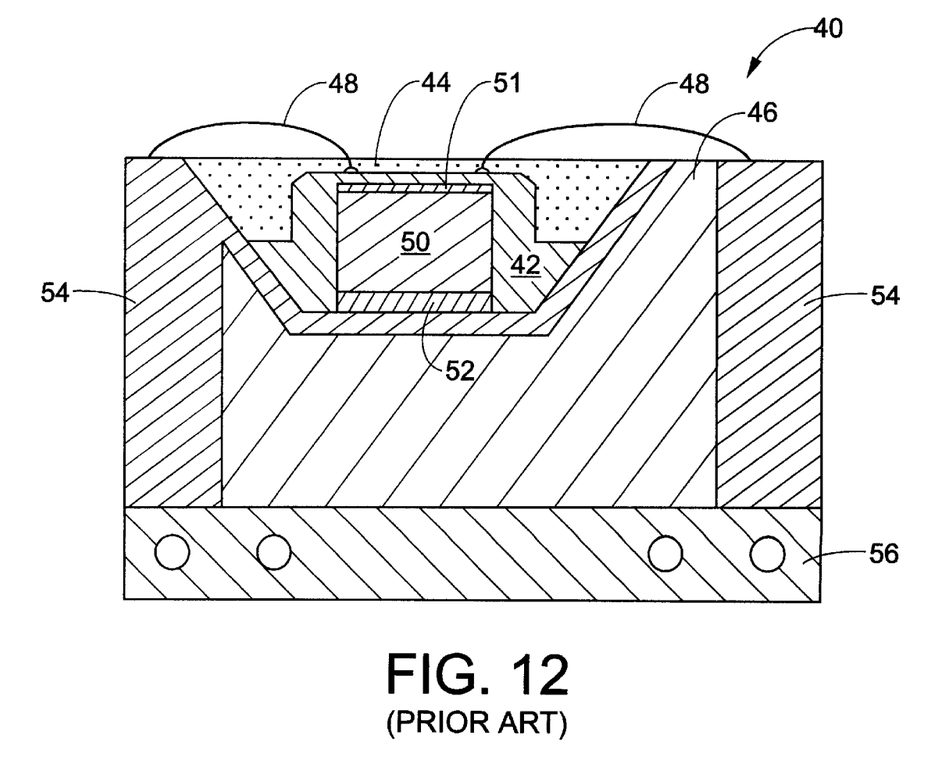
FIG. 12 is cross-sectional view diagram of a pre-packaged wire bonded white LED structure of the prior art shown prior to final encapsulation.

FIG. 12 (PRIOR ART) illustrates a prior art pre-packaged white LED structure 40 with phosphor 42 and silicone rubber (RTV) 44. Because this embodiment is wire bonded, as opposed to a flip chip embodiment, a profile cavity 46 is needed to aid in light directionality. The assembly includes a wire bond 48, LED die 50 on $Al_2O_3$, gallium nitride layer 51, a die attachment 52, lead frame 54, and tie bar 56 for assembly.

Figure 13:
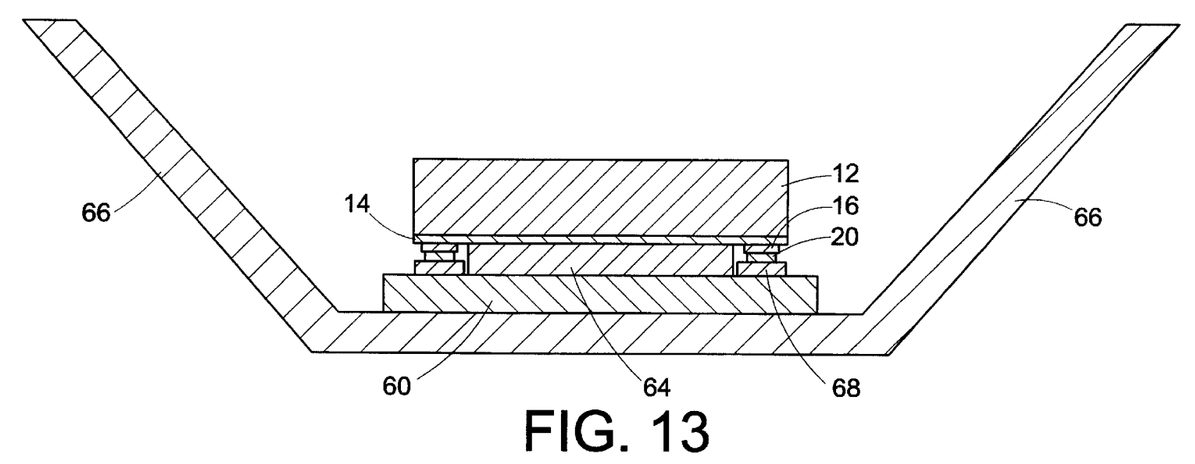
FIG. 13 is a cross-sectional view diagram of a mounted flip chip LED die structure of the present invention.

FIG. 13 is a mounted flip chip LED structure 10 of the present invention. The flip chip embodiment of FIG. 13 includes an interconnect board 60 of the type known to those skilled in the art for electrical connection of the LED. The flip chip LED structure 10 is mounted on a lead frame 66. In contrast to the prior art embodiment illustrated in FIG. 12, wire bonds are not used. Thus, the light path is not blocked.

Phosphor application is used to extract the white light from the UV/blue LED. Phosphor application is used to convert blue, UV, or other light to white light using phosphors well-known to those skilled in the art.

Variations in phosphor thickness of the phosphor layer 62 translate into variations in light out which in turn affects the LED quality, purity, intensity, color, and distribution. Laser die profiling in combination with laser cutting and ablating of the phosphor layer 62 itself greatly aids in phosphor application consistency and uniformity. The die 10 is beveled 45 degrees on the edges, to turn the incident light at 90 degrees. This causes the light turned at the sides to be approximately parallel to the light emitted from the bottom of the die 10, thus aiding in light collection and extraction. Roughening of the die bottom surface 12 or pattering of a lens structure on it, aids in the focusing of the light to a desired shape.

It should be appreciated that the phosphor layer 62 can be applied directly to the bottom of the substrate 12. It may also be applied to the topmost surface of the polymer lensing material 30, index matching material 32, e.g., silicone rubber (RTV) or a layer 28 containing both polymer lensing material 30 and index matching material 32. Additionally, the phosphor layer 62 could be mixed in with the polymer lensing material 30 and applied as a unit step.

Thermal underfilling 64 is well-known to those skilled in the art and is typically an epoxy material impregnated with thermally enhancing materials such as powdered diamond (0.25 to 5 micron size range), alumina, or aluminum nitride, in the 0.25 to 5 micron size range.

Figure 14:
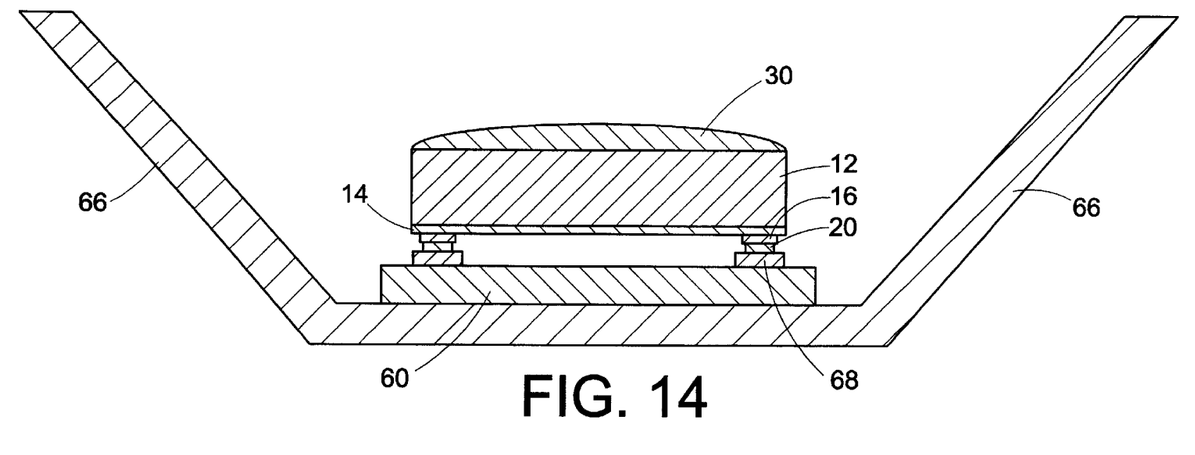
FIG. 14 is a cross-sectional view diagram of a flip chip LED structure of the present invention having an integral lens and mounted in a conventional cup LED package.
Figure 15:
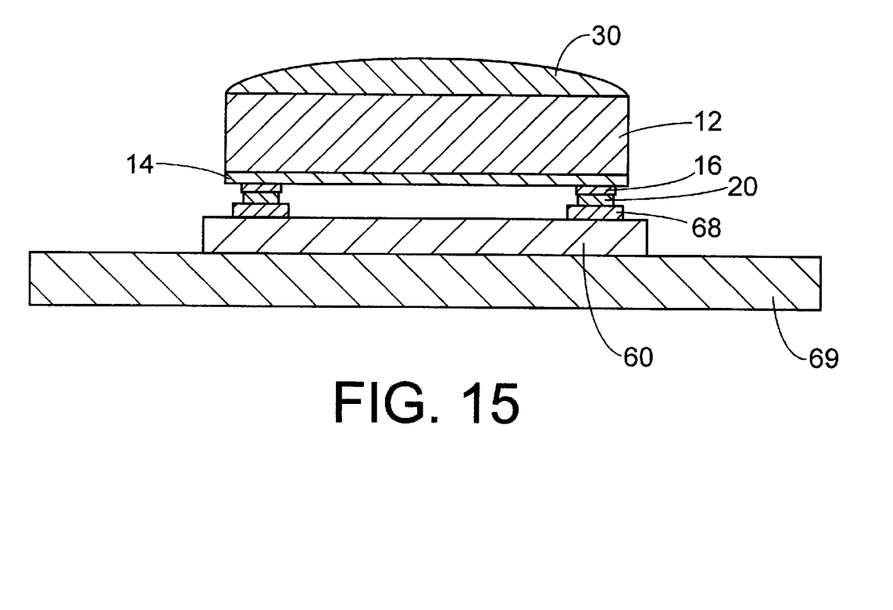
FIG. 15 is a cross-sectional view diagram of another embodiment of a flip chip LED structure of the present invention having an integral lens and mounted in a flat LED assembly.

FIG. 14 is a mounted flip chip LED structure having polymer lensing material 30 applied to aid in light directionality. FIG. 15 illustrates another embodiment of a mounted flip chip LED structure wherein the flip chip LED structure 10 is disposed onto contact pads 68 and soldered or epoxied in place on a flat lead frame 69. The printed circuit board 71 made of a polymer, or ceramic, or silicon, with patterned metal solderable pads (not shown) is comprised of a solderable metal such as copper/nickel/ gold, where the copper is 5–50 microns, the nickel is 0.5–1 micron, and the gold is 0.05 to 0.3 micron.

A conventional metal system for soldering micro BGA technology is well-known to those skilled in the art. The solder may be applied by a screen printed solder paste commercially purchased (e.g., from Indium Corporation of America of Utica N.Y.), and solder heat reflowed to form 4–8 mil solder ball structures on the die wafer, or may be formed by a commercial micro BGA service house. The die are then placed on the printed circuit board (PCB) as solder re-flowed. The solders are typically 63/37 type solders.

Figure 16:
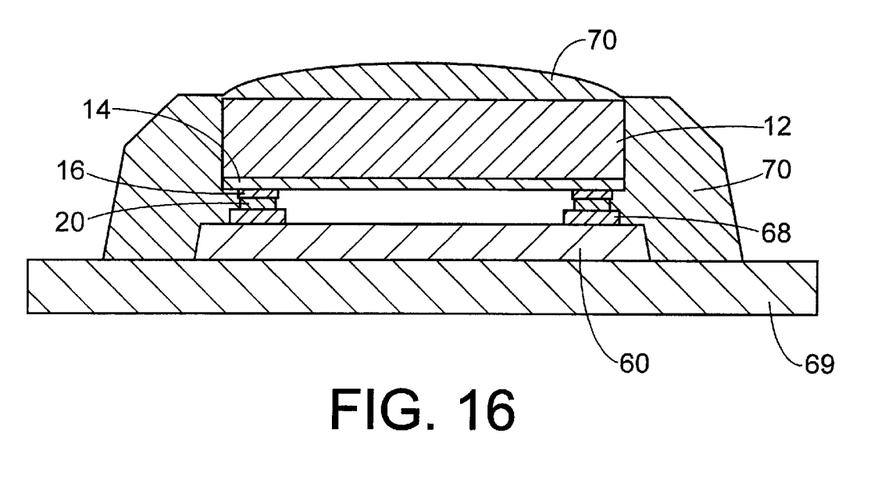
FIG. 16 is a cross-sectional view diagram of the mounted flip chip LED structure of FIG. 15, including a layer of polymer lensing/phosphor material applied to the sides thereof.

FIG. 16 shows the embodiment of FIG. 15, including a layer 70 of polymer lensing and/or phosphor materials applied to the sides, back and front of the LED structure 10. Laser patterning or ablation is useful in forming angle lens patterns. The angle lens may be optimized by inverting the structure. This embodiment obviates the need for a cup lead frame structure such as that illustrated in FIG. 14.

Figure 17:
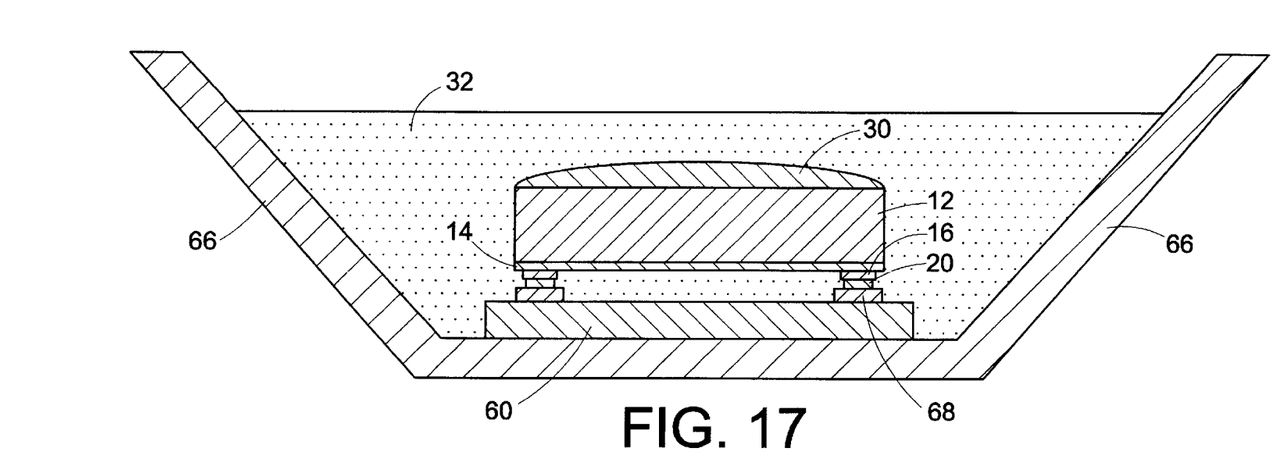
FIG. 17 is a cross-sectional view diagram of the mounted flip chip LED structure of FIG. 14, including index matching material for enhanced light extraction.

FIG. 17 illustrates an embodiment of the mounted flip chip structure of FIG. 14 having a lead frame 66 as well as a mixture of polymer lensing material 30 and index matching material 32. The polymer lensing material 30 and index matching material 32 create a platform for application of the phosphor layer 62 to the surface of the index matching material 32.

Figure 18:
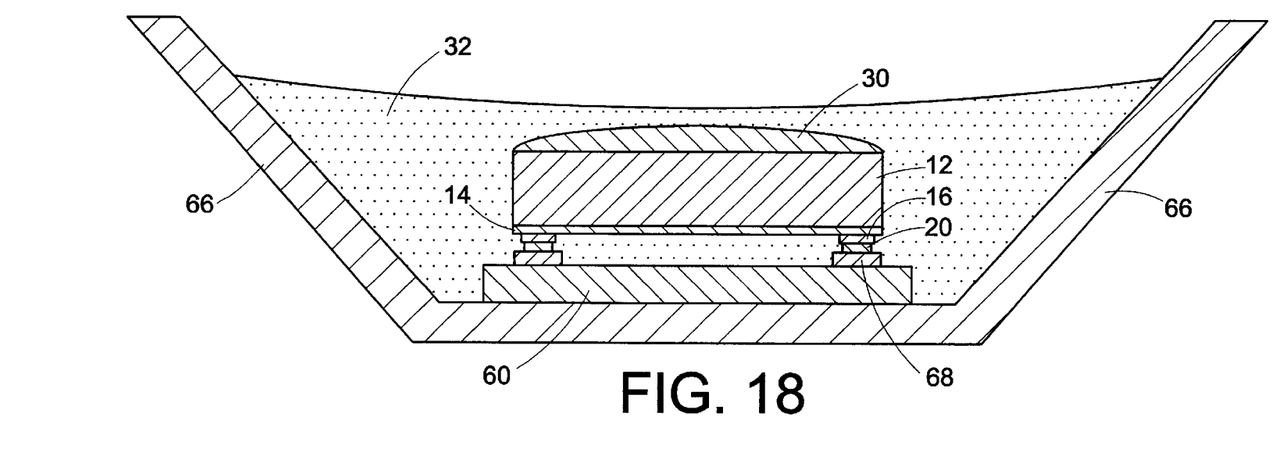
FIG. 18 is a cross-sectional view diagram of a mounted flip chip LED structure of the present invention having index matching material for enhanced light extraction, formed as a curved lensing structure.

FIG. 18 demonstrates application of the index matching material 32 to form additional lens components 72. The surface tension characteristics of the polymer lensing materials 30 and index matching materials 32 may be used to form a concave or convex structure, depending upon the amount of material applied. Application of a greater amount of material creates a domed structure, and thus forms a converging lens, and forming a polymer as noted in FIG. 10, forms a diverging lens. Thus concave and convex lens structures are formed, each having well-known characteristics.

Figure 19:
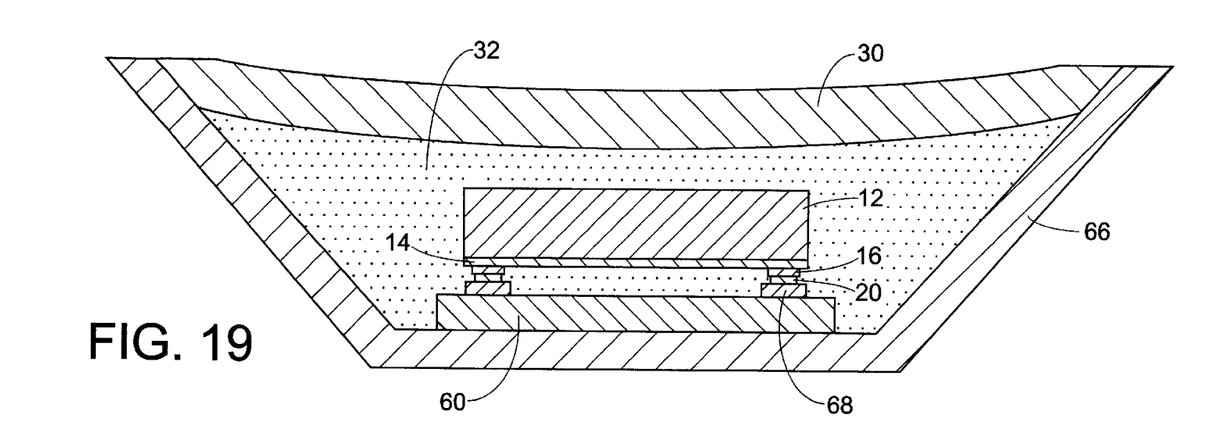
FIG. 19 is a cross-sectional view diagram of the flip chip LED structure of FIG. 18, including a polymer lensing phosphor layer applied to the topmost surface of the index matching light extraction and lensing material.

In the embodiment illustrated in FIG. 19, the phosphor layer 62 is applied to the topmost surface of the lens components 72. The phosphor layer 62 follows the contour of the lens components 72.

Figure 20:
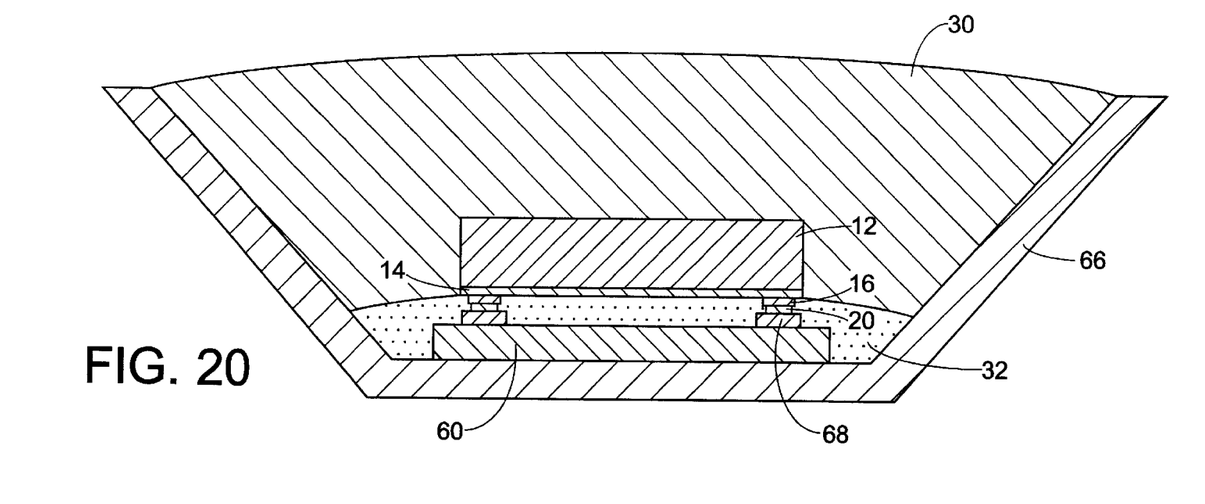
FIG. 20 is a cross-sectional view diagram of another embodiment of a mounted flip chip LED structure of the present invention having a combined index matching material and a polymer light diverging lensing/phosphor layer applied to the bottom surface of the die.

In the embodiment of FIG. 20, the depth of the index matching material 32 is altered to form an LED die structure 10 that differs from that illustrated in FIG. 19. All layers of the index matching material 32 applied have an optical index less than that of the GaN semiconductor layer 14. Each subsequent layer of index matching material 32 is applied with a progressively lower optical index than the one directly below. Each layer of index matching material 32 needs to be about 4% less progressively (as compared to the layer applied directly underneath) as it is applied.

Figure 21:
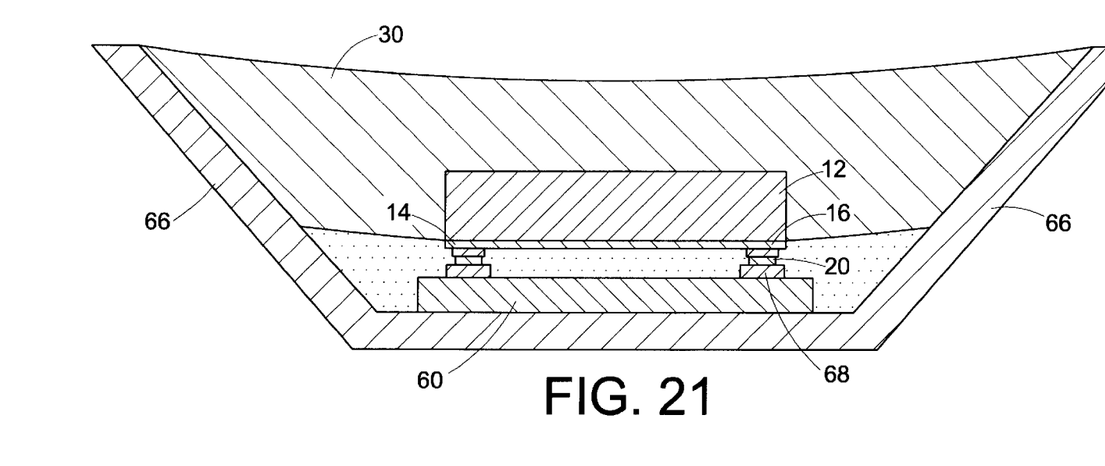
FIG. 21 is a cross-sectional view diagram of a still another embodiment of a mounted flip chip LED structure of the present invention having a combined index matching material and a polymer light converging lensing/phosphor layer applied to the bottom surface of the die.

FIG. 21 illustrates yet another embodiment wherein the depth of the index matching material 32 is modified to produce an LED die structure 10 with light focusing capabilities differing from the structures of FIGS. 19 and 20.

Figure 22:
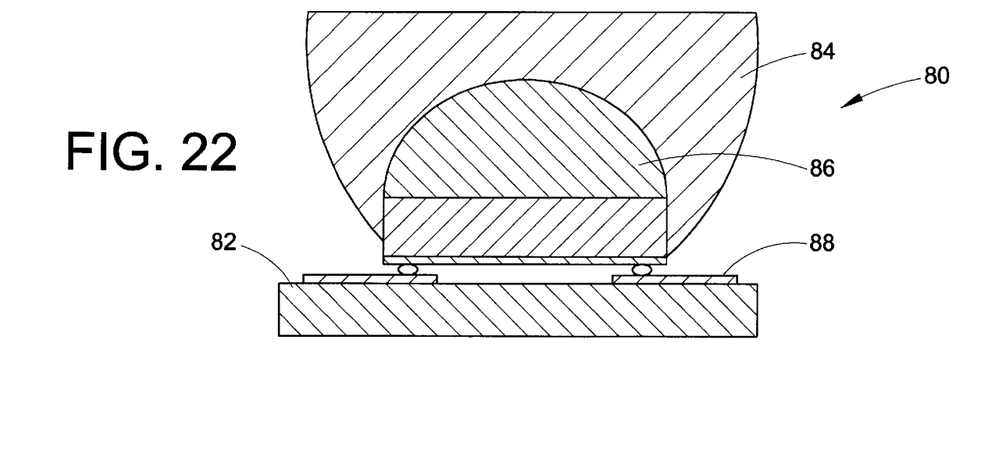
FIG. 22 is a flip chip micro BGA LED structure attached to a micro printed circuit board (PCB), with added reflector assembly for light focus and collection.

FIG. 22 illustrates a pre-packaged white LED structure 80 of the present invention, including a micro printed Circuit Board 82, reflector 84, shaped lens 86 and voltage contact 88 on the printed Circuit Board 82 for the LED die structure 10.

The invention has been described with reference to the preferred embodiment. Obviously, modifications and alterations will occur to others upon the reading and understanding of the specification. For example, design features well-known in the optical industry for redirecting and focusing of light could be implemented in the flip chip LED apparatus provided herein. The invention is intended to include all such modifications and alterations insofar as they come within the scope of the appended claims or the equivalents thereof.

What is claimed is:

1. A semiconductor device formed in a flip chip arrangement comprising:
   a substrate formed of a substantially transparent material;
   a semiconductor layer deposited on a top surface of the substrate; and
   one or more layers of lensing material deposited on a bottom surface of the substrate for redirecting of light, the lensing material being a polymer lensing material, an index matching material or a mixture thereof.

2. The semiconductor device of claim 1 wherein the one or more layers of lensing material further comprise a phosphor material.

3. The semiconductor device of claim 1 further comprising a phosphor material deposited on a topmost surface of the one or more layers of lensing material.

4. The semiconductor device of claim 1 wherein the semiconductor layer is gallium nitride.

5. The semiconductor device of claim 1 further comprising one or more reflectors formed on one or more sides of the semiconductor device.

6. The semiconductor device of claim 5 wherein the one or more reflectors redirect light at a ninety degree angle.

7. The semiconductor device of claim 1 wherein the substrate includes one or more laser ablation areas formed on the bottom surface thereof.

8. The semiconductor device of claim 4 wherein the semiconductor layer is deposited in the form of one or more odd-sided polygons.

9. The semiconductor device of claim 1 wherein the polymer lensing material is selected from the group consisting of epoxy, PMMA, polycarbonate, polyimide or mixtures thereof.

10. The semiconductor device of claim 1 wherein the index matching material is a silicone (RTV).

11. The semiconductor device of claim 1 wherein each layer of the one or more layers of lensing material has a lower index of refraction than that of the substrate and the semiconductor layer.

12. The semiconductor device of claim 1 wherein each layer of the one or more layers of lensing material has an index of refraction lower than the layer of lensing material deposited directly underneath.

13. The semiconductor device of claim 1 wherein the lensing material is further deposited on a topmost surface of the semiconductor layer.

14. The semiconductor device of claim 1 further comprising a fresnel lens positioned on the topmost surface of the layer of lensing material.

15. The semiconductor device of claim 1 wherein the substrate is formed of sapphire ($Al_2O_3$).

16. The semiconductor device of claim 1 wherein the polymer, index matching material or mixture thereof has an optical index lower than that of the semiconductor layer.

17. A light emitting diode (LED) interconnection package comprising:

an LED formed in a flip chip arrangement, the LED comprising a substrate formed of a substantially transparent material, a semiconductor layer deposited on a top surface of the substrate, and one or more layers of a polymer deposited on a bottom surface of the substrate, the LED having a contact surface and bonding pads attached thereto, each bonding pad including a flip chip solder bump;

contact pads connected to the solder bumps;

an interconnect board connected to the contact pads for electrical connection of the LED; and a lead frame connected to the interconnect board.

18. The LED interconnection package of claim 17 wherein the one or more layers of polymer further comprise a phosphor material.

19. The LED interconnection package of claim 17 further comprising a phosphor material deposited on a topmost surface of the one or more layers of polymer.

20. The LED of claim 17 further comprising one or more reflectors formed on one or more sides of the LED.

21. The LED of claim 20 wherein the one or more reflectors redirect light at a ninety degree angle.

22. The LED of claim 17 wherein the substrate includes one or more laser ablation areas formed on the bottom thereof.

23. The LED of claim 17 wherein the semiconductor layer is deposited in the form of one or more odd-sided polygons.

24. The LED of claim 17 wherein the one or more layers of polymer is an epoxy or mixtures thereof.

25. The LED of claim 17 wherein the one or more layers of polymer are further deposited on a topmost surface of the semiconductor layer.

26. The LED of claim 17 further comprising a fresnel lens positioned on the topmost surface of the one or more layers of polymer.

27. The LED of claim 17 wherein the substrate is formed of sapphire ($Al_2O_3$).

28. The LED of claim 17 wherein the semiconductor layer is an epitaxially grown gallium nitride layer.

29. The LED of claim 17 wherein the one or more layers of polymer has a lower index of refraction than the substrate and the semiconductor layer.

30. The LED of claim 17 wherein the semiconductor layer is deposited in the form of one or more odd-sided polygons.

31. A semiconductor device formed in a flip chip arrangement comprising:

a substrate formed of a substantially transparent material; and a semiconductor layer deposited on the top surface of the substrate in the form of one or more odd-sided polygons.

32. The semiconductor device of claim 31 wherein the semiconductor layer is gallium nitride.

33. The semiconductor device of claim 31 further comprising one or more layers of lensing material deposited on the bottom surface of the substrate.

34. The semiconductor device of claim 33 wherein the one or more layers of lensing material have an index of refraction lower than that of the substrate and the semiconductor layer.

35. The semiconductor device of claim 31 wherein the substrate is formed of sapphire ($Al_2O_3$).

36. The semiconductor device of claim 31 wherein the one or more odd-side polygons are electrically connected.

* * * * *

UNITED STATES PATENT AND TRADEMARK OFFICE
CERTIFICATE OF CORRECTION

PATENT NO. : 6,483,196 B1
DATED : November 19, 2002
INVENTOR(S) : Robert J. Wojnarowski et al.

It is certified that error appears in the above-identified patent and that said Letters Patent is hereby corrected as shown below:

Column 1,
Line 2, before "Background of the invention" insert the following paragraph:

-- This invention was made with government support under Contract No. 70NANB8H4022 awarded by NIST. The government may have certain rights to the invention. --

Signed and Sealed this

Fifteenth Day of June, 2004

JON W. DUDAS
*Acting Director of the United States Patent and Trademark Office*